United States Patent [19]

Oppel

[11] 4,193,070

[45] Mar. 11, 1980

[54] METHOD AND ARRANGEMENT FOR CONTROLLING THE ELECTRICAL RELATIONSHIPS OF A CURRENT-INTENSIVE GLOW DISCHARGE

[75] Inventor: Werner Oppel, Cologne, Fed. Rep. of Germany

[73] Assignee: Klockner Ionon GmbH, Cologne, Fed. Rep. of Germany

[21] Appl. No.: 769,163

[22] Filed: Feb. 16, 1977

[30] Foreign Application Priority Data

Feb. 18, 1976 [DE] Fed. Rep. of Germany ....... 2606395

[51] Int. Cl.$^2$ .......................................... G08B 21/00
[52] U.S. Cl. .................... 340/650; 315/127; 340/664; 361/79
[58] Field of Search ................... 340/248 E, 664, 650, 340/661; 361/79; 315/127

[56] References Cited

U.S. PATENT DOCUMENTS

| | | | |
|---|---|---|---|
| 3,564,528 | 2/1971 | Drushel | 340/664 X |
| 3,681,662 | 8/1972 | Spescha | 361/79 |
| 4,034,269 | 7/1977 | Wilkinson | 361/79 |

Primary Examiner—John W. Caldwell, Sr.
Assistant Examiner—Daniel Myer
Attorney, Agent, or Firm—Michael J. Striker

[57] ABSTRACT

In a glow-discharge workpiece-treating system's control system, the existence of a direct short-circuit between workpiece and glow-discharge treatment chamber is ascertained. This is done by comparing a voltage-indicating signal and a current-indicating signal against respective threshold levels, and generating a short-circuit signal when the voltage-indicating signal falls below its threshold level and the current-indicating signal exceeds its threshold level. Preferably, the threshold level for the voltage-indicating signal, although lower than the arc-discharge voltage of the system, is higher than the glow-discharge voltage of the system. When used in combination with conventional arc-discharge-responsive switching action, operative for briefly interrupting and then resuming operation in response to each detected arc discharge during normal operation, this can serve to differentiate between arc discharge, which although undesirable is a part of normal operation, and, on the other hand, actual galvanic short circuiting, for which brief interruption of operation constitutes no remedy at all. In a preferred embodiment, the short-circuit detection involves automatic detection of whether the potential difference between the workpiece and the treatment chamber does or does not exceed a threshold level within a predetermined time interval, corresponding to one or several normal-operation brief interruptions of operation.

9 Claims, 5 Drawing Figures 4,193,070

METHOD AND ARRANGEMENT FOR CONTROLLING THE ELECTRICAL RELATIONSHIPS OF A CURRENT-INTENSIVE GLOW DISCHARGE

BACKGROUND OF THE INVENTION

The use of current-intensive glow discharge for the treatment of workpieces, perhaps for nitride-hardening, metal plating, annealing, hardening, carburizing, decarburizing, or the like is long since known; compare for example U.S. Pat. Nos. 2,916,409, 3,389,070, or 3,260,892. Therein the workpieces in a container are heated due to impact of the ions on the outer surface of the workpieces in an initial heating process, after which the actual treatment takes place, during which the workpieces should be maintained as much as possible at a predetermined temperature, and during which, for example, for nitride-hardening nitrogen atoms diffuse into the outer surface of the workpieces in order to provide in this manner an outer surface hardening. Eventually arcing, which can disadvantageously influence the workpieces, occurs during the entire process and is continually switched off by a switch responsive to discharge disturbances. Thereby the operating current is shut off for a short time; however, after a slight time interval, in which the arcing is generally extinguished, the current flow is again switched on.

For such a switching off of the supply current upon the occurrence of arcing, a switch in accordance with U.S. Pat. Nos. 3,579,029 and 3,681,662 is used. If however, for example, a short circuit occurs, in which perhaps a workpiece which is connected with the negative pole of a voltage source comes into contact with the wall of the container which is connected with the positive pole, a short circuit to the container is present in the operation, or the cathodically connected inner electrode rests against the anode, thus the voltage drops correspondingly so that the switch operates. By renewed switching on through the switch, the operating voltage can however not again be achieved so that the switch is continuously switched on and off, whereby the glow discharge process is not further continued. It is however not detectable from outside why this happens and that the process is not functioning.

SUMMARY OF THE INVENTION

It is therefore an object of the present invention to provide a method and an arrangement of this particular art which makes possible short circuit detection.

Subject matter of the invention is therefore a method for controlling the electrical relationships of a current-intensive glow discharge in a container, whereby, for an operating current $I_{ist}$ greater than an adjustable predetermined threshold value $I_O$ and for an operating voltage $U_{ist}$, which is smaller than an adjustable predetermined threshold value $U_O$, a control signal is generated for momentarily switching off of the operating current for the extinguishment of arcing, by which in the case, in which the threshold value $U_O$ is not exceeded during a predetermined time, which is longer than the detecting and extinguishing of arcing, and/or in the case, in which the operating voltage falls below a predetermined adjustable threshold value smaller than the arcing voltage $U_L$, a control signal is generated for entirely switching off the operating current, if simultaneously $I_{ist}$ is greater than $I_O$.

If in addition for the control of the electrical relationships of the current-intensive glow discharge, a control signal for the possibly momentary reduction or switching off of the operating current $I_{ist}$ for the glow discharge is produced by a switch responsive to arcing, and if the operating point of the glow discharge in the voltage-current family of curves falls into the area of unstable discharge, it is advisable if the switching off signal is generated if $U_O$ lies between the glow discharge voltage $U_{Gl}$ and the arcing voltage $U_L$.

This method is especially advantageous in the case that no second safety measure is provided in addition to the switch, and indeed for the case that the switch malfunctions for any reason. The latter is especially critical for current-regulated arrangements for current-intensive glow discharge since, upon malfunction of the switch, it is automatically endeavoured to stabilize the current so that a steady arcing is formed in the container if no short circuit is present. The entire switching off of the supply current follows after a predetermined time duration, which can be chosen in size from 1 to 2 seconds, as well as by the occurrence of a short circuit, as also by the occurrence of an electric arc and simultaneous malfunction of the switch responsive to the electric arc.

The method according to the invention is performed in a circuit arrangement for controlling the electrical glow discharge in a container for the metallurgical treatment of workpieces in a gaseous atmosphere with a switching circuit for the generation of a control signal for the momentary switching off of the operating current for the extinguishment of an arc, if the operating current $I_{ist}$ is larger than an adjustable predetermined threshold value $I_O$ and the operating voltage $U_{ist}$ is smaller than an adjustable predetermined threshold value $U_O$, including a comparator for $U_{ist}$ and $U_O$ whose output is connected with an input of an AND-gate, whose other input is connected with the output of a comparator for $I_{ist}$ and $I_O$, and the output of the AND-gate supplies the control signal for entirely switching off the operating current, while a timing member is provided in the circuit part which has the comparator and the AND-gate, and/or $U_O$ is adjusted to a value smaller than the arcing voltage $U_L$.

A maximum value accumulator with parallel connected discharge resistance can be used as a timing member.

DESCRIPTION OF THE PREFERRED EMBODIMENTS

Figure 5:
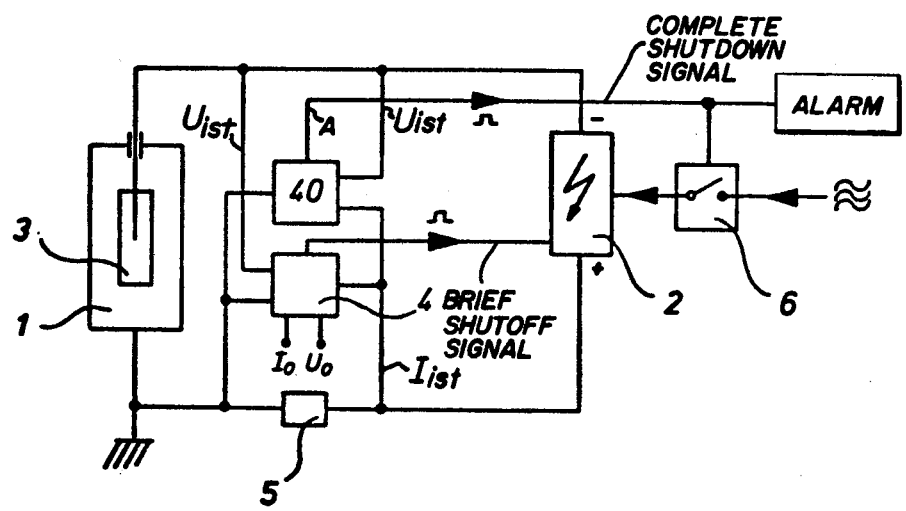
FIG. 5 shows schematically an arrangement for treating of workpieces by glow discharge.

By the arrangement illustrated in FIG. 5 a container 1 is connected to the positive pole of a high voltage source 2 for D.C. voltage, while one or more workpieces 3, which are located in the container 1, are electrically insulated relative to the latter and are connected with the negative pole of the high voltage source 2. The operating voltage $U_{ist}$ or a voltage proportionally derived from a not-illustrated voltage divider is applied to the upper left input of a switch 4 responsive to discharge disturbances and to the upper right input of a subsequently more clearly described circuit arrangement 40. Further a voltage proportional to the operating current $I_{ist}$ is tapped off, at a shunt 5 which is located in the + − conductor to the container 1, and applied to the right input of switch 4 and to the lower right input of circuit arrangement 40. In the case of a discharge disturbance the switch 4 generates a shut-off signal which is conducted to the high voltage source 2 and leads to a momentary interruption of the operating current. Switch 4 can be of the conventional type shown, e.g., in U.S. Pat. No. 3,681,662, FIG. 2, at 20 plus 4; however, persons skilled in this art will be familiar with the fact that many other versions of monitoring switch 4 are available and conventionally employed. In the case of the short circuit the circuit arrangement 40 generates a switching command, which is conducted to a switch 6, which is located in the line current supply of the high voltage source 2, whereby by such a switching command the current supply is completely switched off and possibly an optical or an acoustic alarm signal follows.

Figure 1:
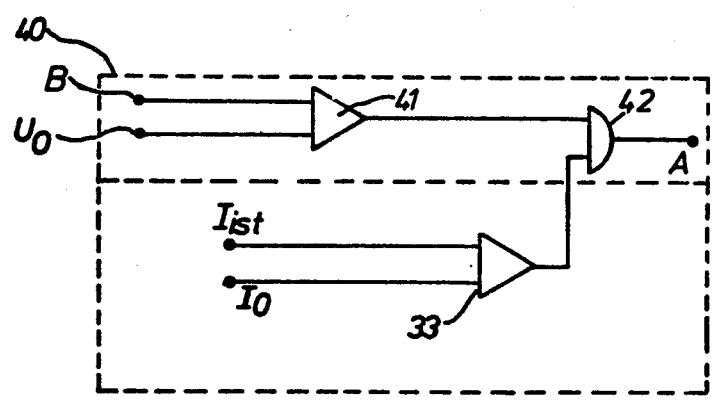
FIG. 1 shows schematically the circuit diagram of a circuit arrangement according to a first embodiment for switching off the current-intensive glow discharge upon the occurrence of a short circuit.

The circuit arrangement illustrated in FIG. 1 includes a switching circuit 40 for supplying a shut-off signal which is essentially formed of a comparator 41, at whose inputs are connected the operating voltage $U_{ist}$ and a comparison voltage $U_O$ which is smaller than the arcing voltage. The output of the comparator 41 is connected with an input of an AND-gate 42. At the inputs of a further comparator 33 is connected a voltage proportional to the operating current and a comparison current $I_O$. The comparator 33 supplies an output corresponding to the comparison of $I_{ist}$ and $I_O$, which is supplied to the other input of the AND-gate 42. The output of the AND-gate 42 supplies the shut-off signal, if $U_{ist}$ is smaller than $U_O$ and $I_{ist}$ is larger than $I_O$, i.e. a short circuit exists, and $U_O$ is smaller than the arcing voltage $U_L$.

This signal can simultaneously serve for actuation of a not illustrated short circuit indicator arrangement, perhaps an indicating lamp.

By use of a switch responsive to discharge disturbances for the determination of discharge disturbances as arcing occurring during glow discharge, the circuit arrangement illustrated in FIG. 1 for the determination of a short circuit must operate at least as quickly as this switch in order that the latter has not already shut off before the short circuit is detected.

Figure 2:
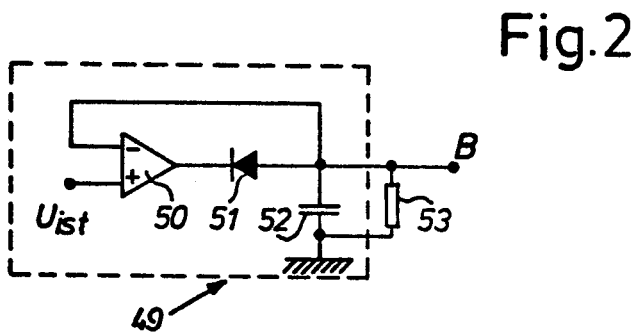
FIG. 2 shows the circuit diagram of a circuit part for a second embodiment of a circuit arrangement for switching off of the current-intensive glow discharge upon the occurrence of a short circuit as well as by the formation of a steady electric arc.

The circuit illustrated in FIG. 2 shows a maximum value accumulator 49 which has a comparator 50, at which an input is connected to the operating voltage $U_{ist}$. The other input of the comparator 50 is back-coupled with the output of the comparator through a diode 51. The back-coupled output of the comparator 50 is connected with a grounded capacitor 52, which is charged by the comparator 50 corresponding to the maximum value of the operating voltage $U_{ist}$. The capacitor 52 can discharge due to diode 51 only through a discharge resistor 53 connected in parallel to the maximum value accumulator 49, whereby the RC-component formed out of the capacitor 52 and the resistor 53 determine the time constant of the maximum value accumulator 49.

The maximum value accumulator 49 with the parallel connected discharge resistor 53 is connected for example to the input of the comparator 41, at which $U_{ist}$ is connected, as indicated by B in FIGS. 1 and 2. Thereby small disturbances can be eliminated and short circuit simulations are prevented. Besides the circuit arrangement exhibits in addition to its function as a short circuit detection arrangement a safety arrangement for the case that the switch for controlling the discharge disturbances as arcing should malfunction.

Figure 3:
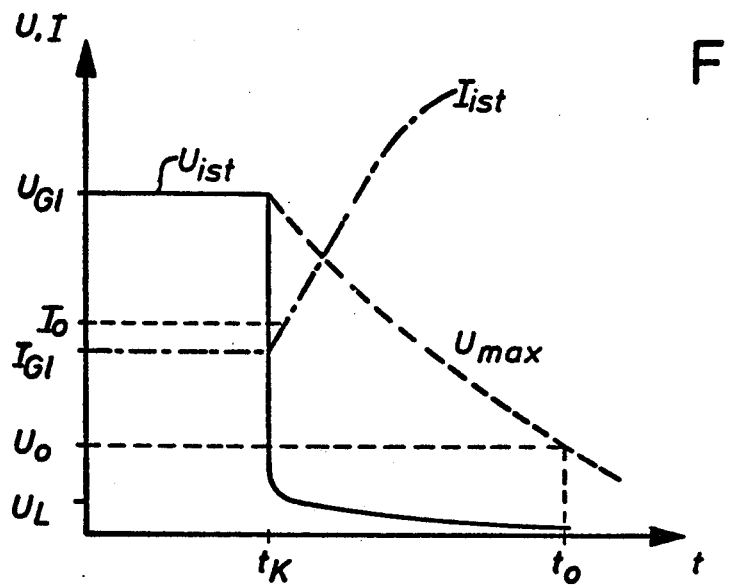
FIG. 3 shows schematically the time curve of operating voltage and of operating current upon malfunction of a switch responsive to discharge in order to control the glow discharge.

By the diagram indicated in FIG. 3 the operating voltage $U_{ist}$ and the operating current $I_{ist}$ are schematically illustrated. Up to the time point $t_K$ the operating voltage $U_{ist}$ is identical to the voltage $U_{Gl}$ of the glow discharge. At the time point $t_K$ a short circuit occurs which is operative to lower $U_{ist}$ to a value beneath the threshold value $U_O$. $U_O$ is here greater than the arcing voltage $U_L$. The operating current $I_{ist}$, which up until the time point $t_K$ is identical to the glow discharge current $I_{Gl}$, strongly increases due to the occurring short circuit at the time point $t_K$ and increases beyond the threshold value $I_O$. The voltage $U_{max}$ of the maximum value accumulator has the value $U_{ist}$ at the time point $t_K$ and falls exponentially from the time point $t_K$. If the voltage $U_{max}$ of the maximum value accumulator falls below the value $U_O$ at the time point $t_O$ the shut-off signal for completely shutting off the glow discharge arrangement is produced, since in this case $I_{ist}$ is also larger than $I_O$. Indeed it is advantageous if $I_O$ is normally greater than $I_{Gl}$, however, this is not mandatory.

Figure 4:
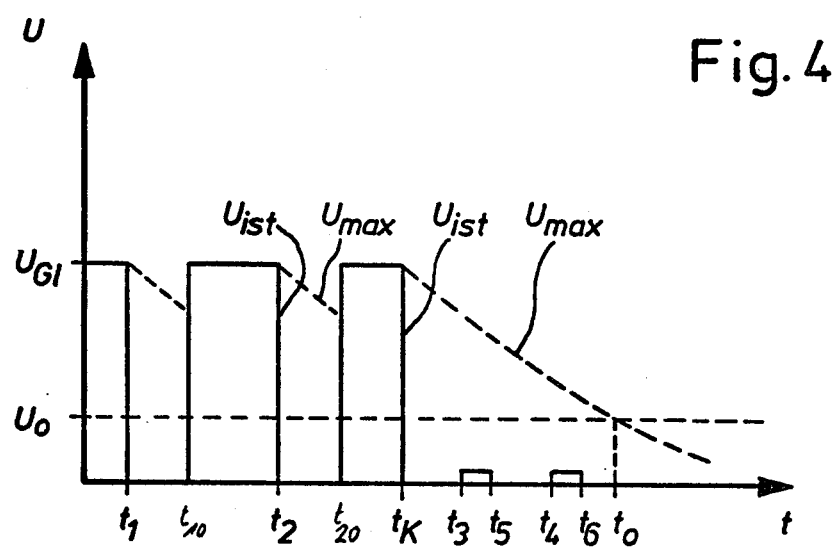
FIG. 4 shows the voltage characteristic at the maximum value accumulator for the switch working in response to discharge and the occurrence of a short circuit.

If the operating current is interrupted only momentarily by switching of the switch responsive to discharge disturbances approximately at the occurrence of an arc in the container at the time points $t_1$, $t_2$ and is further switched on at the time points $t_{10}$ and $t_{20}$, then the capacitor 52 can due to the parallel connected resistor 53 and a correspondingly chosen large time constant for this RC-component only be slightly discharged (compare FIG. 4) in the time intervals $t_1-t_{10}$, and $t_2-t_{20}$, so that the comparator 54 does not correspondingly change its output signal. A further subsequent switching on at the time points $t_3$, $t_4$ and switching off at the time points $t_5$, $t_6$ by the switch responsive to discharge disturbances does not influence the discharge of the capacitor 52 and therewith the generation of the shutoff signal, since the operating voltage $U_{ist}$ cannot be regulated to return to its original level due to the short circuit.

As well as in the case of a short circuit as also in the case of the formation of a steady arc in the container, $U_{ist}$ is smaller than $U_O$, so that by the malfunction of the switch responsive to discharge disturbances the circuit arrangement serves also as an additional safety circuit to a customary switch operative discharge disturbances.

While the invention has been described and illustrated in the context of a method and an arrangement for controlling the electrical relationships of a current-intensive glow discharge, it is however not to be limited to the illustrated and described characteristics, indeed different changes are possible without departing from the context of the present invention.

I claim:

1. An improved control method for controlling a glow-discharge treatment, the glow-discharge treatment being of the type in which a workpiece is accommodated in a treatment container and subjected to a glow-discharge field established between the workpiece and the treatment chamber, the control method being of the type comprising:

continually generating a voltage-indicating signal $U_{ist}$ whose value indicates the potential difference between the workpiece and the container, continually generating a current-indicating signal $I_{ist}$ whose value indicates the current flowing between the workpiece and the container, and applying the voltage- and current-indicating signals $U_{ist}$ and $I_{ist}$ to a discharge-disturbance-responsive switching device operative for briefly interrupting the glow-discharge treatment for a limited predetermined time interval when the voltage- and current-indicating signals in conjunction assume values indicating the development of an arc discharge, the improvement comprising furthermore detecting the existence of a short-circuit between the workpiece and treatment container, this comprising using comparators to compare the voltage-indicating signal $U_{ist}$ against a predetermined threshold voltage level $U_O$ and to compare the current-indicating signal $I_{ist}$ against a predetermined threshold current level $I_O$, and generating a shutdown signal effecting persisting complete shutdown of the glow-discharge treatment when $U_{ist}$ is below $U_O$ and concurrently $I_{ist}$ is above $I_O$, whereby the detection of a short-circuit and the resultant generation of the shutdown signal prevent the discharge-disturbance-responsive switching device from effecting protractedly repeated brief interruption and resumption of the glow-discharge treatment in the case of a short-circuit between the workpiece and the container.

2. The method defined in claim 1, the detecting of the existence of a short-circuit between the workpiece and the container furthermore comprising the step of using a timing device to ascertain whether the voltage-indicating signal $U_{ist}$ is below the threshold voltage level $U_O$ for more than a predetermined length of time at least equal to said predetermined time interval and generating the shutdown signal only if $U_{ist}$ is below $U_O$ for at least said predetermined length of time with $I_{ist}$ concurrently being above $I_O$.

3. The method defined in claim 2, the threshold voltage level $U_O$ being lower than the glow-discharge voltage $U_{Gl}$ of the glow-discharge treatment but being higher than the arcing voltage $U_L$ of the glow-discharge treatment, whereby if an arc discharge develops between the workpiece and the container but the discharge-disturbance-responsive switching device malfunctions the shutdown signal will inherently provide fail-safe action effecting persisting complete shutdown of the glow-discharge treatment.

4. In a glow-discharge workpiece-treating system of the type comprising a treatment container accommodating a workpiece and means establishing a glow-discharge field between the workpiece and the container, an improved control system for the workpiece-treating system, the control system being of the type which comprises means continually generating a voltage-indicating signal $U_{ist}$ whose value indicates the potential difference between the workpiece and the container, means continually generating a current-indicating signal $I_{ist}$ whose value indicates the current flowing between the workpiece and the container, and discharge-disturbance-responsive switching means receiving the voltage- and current-indicating signals $U_{ist}$ and $I_{ist}$ and operative for briefly interrupting the glow-discharge treatment for a limited predetermined time interval when the voltage- and current-indicating signals in conjunction assume values indicating the development of an arc discharge, the improvement comprising short-circuit detecting means operative for detecting the existence of a short circuit between the workpiece and the treatment container, the detecting means comprising means operative for comparing the voltage-indicating signal $U_{ist}$ against a predetermined threshold voltage level $U_O$ and for comparing the current-indicating signal $I_{ist}$ against a predetermined threshold current level $I_O$, and means generating a shutdown signal effecting persisting complete shutdown of the glow-discharge treatment when $U_{ist}$ is below $U_O$ and concurrently $I_{ist}$ is above $I_O$, whereby the detection of a short-circuit and the resultant generation of the shutdown signal prevent protractedly repeated brief interruption and resumption of the glow-discharge treatment by the discharge-disturbance-responsive switching means in the case of a short-circuit between the workpiece and the container.

5. The control system defined in claim 4, the threshold voltage level $U_O$ being lower than the arcing voltage $U_L$ of the glow-discharge treatment, whereby the shutdown signal cannot be generated in response to mere development of an arc discharge between the workpiece and the container.

6. The control system defined in claim 4, the short-circuit detecting means furthermore comprising timing means operative for ascertaining whether the voltage-indicating signal $U_{ist}$ is below the threshold voltage level $U_O$ for more than a predetermined length of time at least equal to said predetermined time interval and means generating the shutdown signal only if $U_{ist}$ is below $U_O$ for at least said predetermined length of time with $I_{ist}$ concurrently being above $I_O$.

7. The control system defined in claim 6, the threshold voltage level $U_O$ being lower than the glow-discharge voltage $U_{Gl}$ of the glow-discharge treatment but being higher than the arcing voltage $U_L$ of the glow-discharge treatment, whereby if an arc discharge develops between the workpiece and the container but the discharge-disturbance-responsive switching device fails to operate the shutdown signal will inherently provide fail-safe action effecting persisting complete shutdown of the glow-discharge treatment.

8. The control system defined in claim 6, the timing means comprising peak-value storing means receiving the voltage-indicating signal and including energy-storing means and discharge means connected in circuit with the energy-storing means for discharging the energy-storing means.

9. The method defined in claim 1, the threshold voltage level $U_O$ being lower than the arcing voltage $U_L$ of the glow-discharge treatment, whereby the shutdown signal cannot be generated in response to mere development of an arc discharge between the workpiece and the container.

* * * * *